(12) United States Patent
Tsukihara

(10) Patent No.: US 8,451,536 B2
(45) Date of Patent: May 28, 2013

(54) IRRADIATION APPARATUS AND MANUFACTURING METHOD FOR SEMICONDUCTOR DEVICE

(75) Inventor: Koichi Tsukihara, Kanagawa (JP)

(73) Assignee: Sony Corporation, Tokyo (JP)

( * ) Notice: Subject to any disclaimer, the term of this patent is extended or adjusted under 35 U.S.C. 154(b) by 405 days.

(21) Appl. No.: 12/792,327

(22) Filed: Jun. 2, 2010

(65) Prior Publication Data

US 2010/0320401 A1 Dec. 23, 2010

(30) Foreign Application Priority Data

Jun. 17, 2009 (JP) .................................. 2009-144527

(51) Int. Cl.
*G02B 27/10* (2006.01)

(52) U.S. Cl.
USPC ................. 359/483.01; 359/900; 219/121.76; 438/795

(58) Field of Classification Search
USPC ................ 359/483.01, 490.01; 438/166, 308, 438/795, 799; 219/121.73, 121.76
See application file for complete search history.

(56) References Cited

U.S. PATENT DOCUMENTS

| 5,959,779 A | 9/1999 | Yamazaki et al. |
| 6,734,081 B1 * | 5/2004 | Puchner et al. ............... 438/432 |
| 7,049,544 B2 * | 5/2006 | Landau .................... 219/121.73 |
| 2004/0195222 A1 * | 10/2004 | Tanaka et al. ............. 219/121.73 |
| 2009/0233456 A1 * | 9/2009 | Tsukihara ..................... 438/795 |

FOREIGN PATENT DOCUMENTS

| JP | 10-244392 | 9/1998 |
| JP | 3947065 | 4/2007 |

* cited by examiner

*Primary Examiner* — Frank Font
(74) *Attorney, Agent, or Firm* — Dentons US LLP

(57) ABSTRACT

Disclosed herein is an irradiation apparatus including: laser light source; a polarization splitting section configured to split laser light emitted from the laser light source into first linearly polarized light and second linearly polarized light different in polarization direction; a light beam dividing section configured to divide the first or second linearly polarized light into a plurality of light beams; a quarter-wave plate array composed of a plurality of first quarter-wave plates for converting some of the light beams into right circularly polarized light and a plurality of second quarter-wave plates for converting the other of the light beams into left circularly polarized light, the first quarter-wave plates and the second quarter-wave plates being alternately arranged in a first direction perpendicular to an optical axis; and a projection optical system for condensing the right circularly polarized light and the left circularly polarized light toward a work surface to be irradiated.

1 Claim, 9 Drawing Sheets

F I G . 1
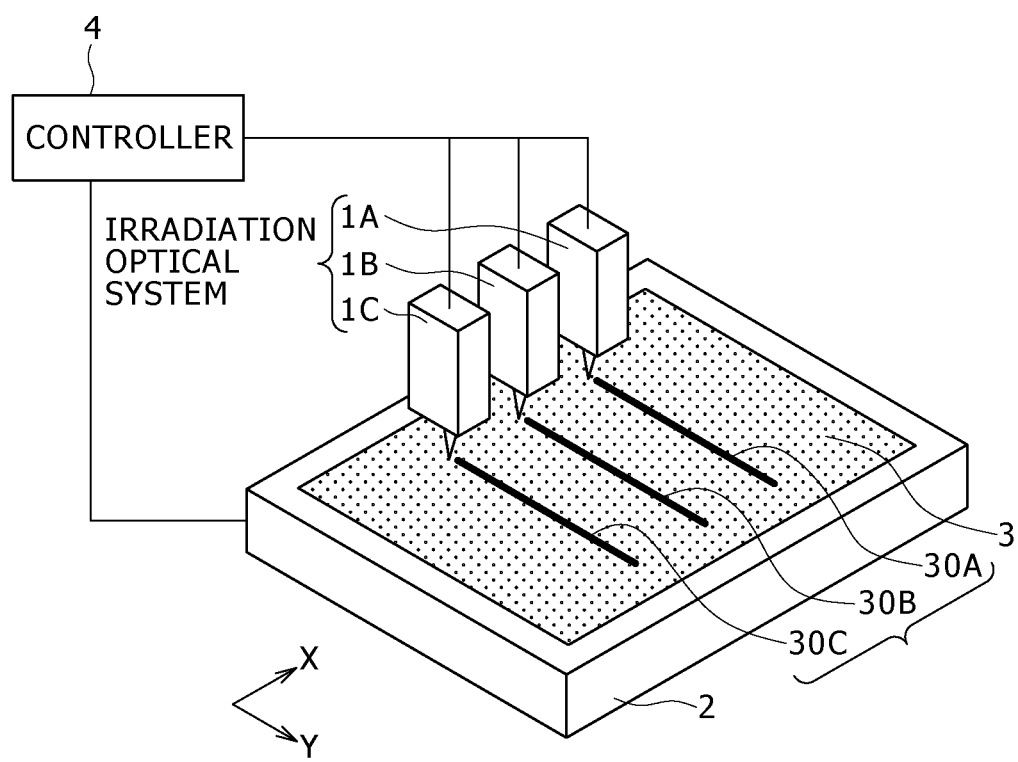

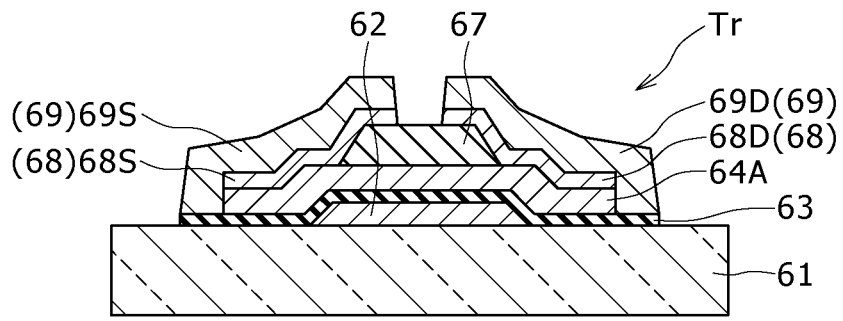
FIG.8F
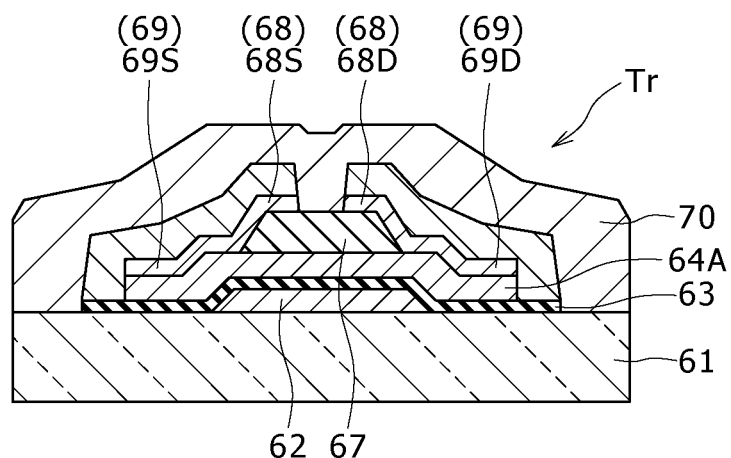
FIG.8G
FIG.9
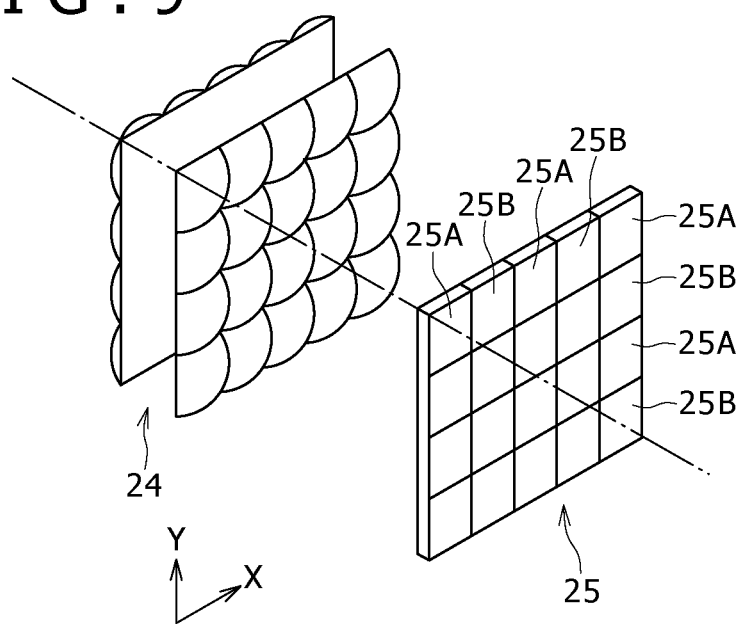

IRRADIATION APPARATUS AND MANUFACTURING METHOD FOR SEMICONDUCTOR DEVICE

BACKGROUND OF THE INVENTION

1. Field of the Invention

The present invention relates to an irradiation apparatus for applying a laser beam to a workpiece such as a semiconductor film to thereby perform various kinds of processing and a manufacturing method for a semiconductor device using the irradiation apparatus.

2. Description of the Related Art

In the past, a polycrystalline silicon film is used for a driving circuit device, switching device, etc. in a liquid crystal display and an organic EL (Electroluminescence) display device. Such a polycrystalline silicon film is formed by applying a laser beam to an amorphous silicon film formed by sputtering or the like to thereby anneal the amorphous silicon film. In performing such annealing by applying the laser beam, the spot shape of the laser beam is preferably made linear in order to improve the processing efficiency. Further, in forming a uniform polycrystalline silicon film (reduced in crystallinity deviation) by using a laser beam (linear beam) having such a linear spot shape, it is important to reduce the deviation in intensity distribution of the linear beam in the longitudinal direction of the spot shape, thereby reducing the nonuniformity of irradiation to the amorphous silicon film.

Under such circumstances, there has been proposed a method of applying a laser beam having an intensity uniformed in a plane perpendicular to an optical axis by interposing a lens array between a laser light source and a workpiece (amorphous silicon thin-film) (see Japanese Patent Laid-open No. Hei 10-244392 referred to as Patent Document 1, for example).

However, when a plurality of light beams divided by the lens array are superimposed on each other by a condenser lens toward the workpiece, interference fringes depending upon the spatial coherency of the laser light source are generated on a work surface of the workpiece. The generation of such interference fringes promotes the nonuniformity of irradiation and it is therefore undesirable. To solve this problem, there has been disclosed a technique such that a plurality of half-wave plates are provided downstream of the lens array toward the workpiece so as to be arranged at given intervals, thereby converting the adjacent light beams into two kinds of linearly polarized light having orthogonal polarization directions (see Japanese Patent No. 3947065 referred to as Patent Document 2 hereinafter, for example).

SUMMARY OF THE INVENTION

However, in the case that a semiconductor laser light source is used as the light source in the method disclosed in Patent Document 2, reflected light from the workpiece is returned to the semiconductor laser light source, causing the instability of an oscillating operation or the degradation in the semiconductor laser light source. Further, when the half-wave plates are arranged in a condensing system, the laser light is incident on the half-wave plates at a given incident angle (i.e., the laser light does not always enter perpendicularly to the half-wave plates), so that the function of the half-wave plates is not sufficiently exhibited in some case. In this case, the effect of suppressing the interference fringes may not be sufficiently obtained.

It is accordingly a first desire of the present invention to provide an irradiation apparatus which can apply a laser beam having a uniform intensity distribution in the condition where the return light from the workpiece is prevented from entering the laser light source.

It is a second desire of the present invention to provide a manufacturing method for a semiconductor device having a polycystalline semiconductor film uniformly crystallized.

In accordance with an embodiment of the present invention, there is provided an irradiation apparatus including a laser light source; polarization splitting means for splitting laser light emitted from the laser light source into first linearly polarized light and second linearly polarized light different in polarization direction; light beam dividing means for dividing the first or second linearly polarized light into a plurality of light beams; a quarter-wave plate array composed of a plurality of first quarter-wave plates for converting some of the light beams into right circularly polarized light and a plurality of second quarter-wave plates for converting the other of the light beams into left circularly polarized light, the first quarter-wave plates and the second quarter-wave plates being alternately arranged in a first direction perpendicular to an optical axis; and a projection optical system for condensing the right circularly polarized light and the left circularly polarized light toward a work surface to be irradiated.

In the irradiation apparatus according to an embodiment of the present invention, the laser light emitted from the laser light source is divided into a plurality of light beams by the light beam dividing means and thereafter applied to the work surface. Therefore, a laser beam having a uniform intensity distribution can be obtained. Further, the light beams divided above are next converted into right circularly polarized light and left circularly polarized light by the first and second quarter-wave plates alternately arranged in the first direction. Accordingly, the right circularly polarized light and the left circularly polarized light are emerged from the quarter-wave plate array so as to be arranged adjacent to each other in the first direction. Therefore, the generation of interference fringes in the first direction can be sufficiently suppressed. Further, the polarization splitting means is provided between the laser light source and the quarter-wave plate array. Accordingly, an isolator is configured by the quarter-wave plate array and the polarization splitting means. Therefore, reflected light from the work surface can be prevented from entering the laser light source.

In accordance with another embodiment of the present invention, there is provided a manufacturing method for a semiconductor device including the steps of forming an amorphous semiconductor film and a light absorbing layer in this order on a substrate; and annealing by applying laser light to the light absorbing layer to heat the light absorbing layer, thereby crystallizing the amorphous semiconductor film to form a crystalline semiconductor film. The annealing step has the steps of oscillating emitted laser light from a laser light source; splitting the emitted laser light into first linearly polarized light and second linearly polarized light different in polarization direction; dividing the first or second linearly polarized light into a plurality of light beams; converting the light beams into right circularly polarized light and left circularly polarized light alternately arranged in a first direction perpendicular to an optical axis; and condensing the right circularly polarized light and the left circularly polarized light toward the light absorbing layer.

In the manufacturing method for the semiconductor device according to an embodiment of the present invention, the laser light emitted from the laser light source is divided into a plurality of light beams and thereafter applied to the light absorbing layer. Therefore, a laser beam having a uniform intensity distribution can be obtained. Further, the light beams divided above are next converted into right circularly polarized light and left circularly polarized light alternately arranged in the first direction. Therefore, the generation of interference fringes in the first direction can be sufficiently suppressed. Further, prior to converting the emitted laser light into the right circularly polarized light and the left circularly polarized light, the emitted laser light is split into the first linearly polarized light and the second linearly polarized light different in polarization direction. Therefore, reflected light from the light absorbing layer can be prevented from entering the laser light source.

According to the irradiation apparatus of an embodiment of the present invention, the laser light emitted from the laser light source is divided into a plurality of light beams. Thereafter, these light beams are converted into right circularly polarized light and left circularly polarized light by the quarter-wave plate array so that the right and left circularly polarized lights are alternately arranged in the first direction. Therefore, the generation of interference fringes in the first direction can be sufficiently reduced and a laser beam having a uniform intensity distribution can be applied to the work surface. Further, the polarization splitting means constituting an isolator in combination with the quarter-wave plate array is provided upstream of the quarter-wave plate array toward the laser light source. Therefore, reflected light (return light) from the work surface toward the laser light source can be sufficiently reduced, thereby realizing the stabilization of an oscillating operation of the laser light source and the extension of the life of the laser light source.

According to the manufacturing method for the semiconductor device of an embodiment of the present invention, the laser light emitted from the laser light source is divided into a plurality of light beams, and these light beams are next converted into right circularly polarized light and left circularly polarized light alternately arranged in the first direction. Therefore, the generation of interference fringes in the first direction can be sufficiently reduced and a laser beam having a uniform intensity distribution can be applied to the light absorbing layer. Further, prior to converting the emitted laser light into the right circularly polarized light and the left circularly polarized light, the emitted laser light is split into the first linearly polarized light and the second linearly polarized light different in polarization direction. Therefore, reflected light (return light) from the light absorbing layer toward the laser light source can be sufficiently reduced, thereby realizing the stabilization of the oscillating operation and the extension of the life of the laser light source. As a result, it is possible to easily obtain a good-quality semiconductor device having a polycrystalline semiconductor film uniformly crystallized.

BRIEF DESCRIPTION OF THE DRAWINGS

FIG. 1 is a perspective view showing the general configuration of an irradiation apparatus according to a preferred embodiment of the present invention;

FIGS. 8A to 8G are sectional views showing the steps of a manufacturing method for a thin-film transistor device by the use of the irradiation apparatus of the present invention; and FIG. 9 is a perspective view showing a modification of a light beam dividing section and the quarter-wave plate array in the irradiation optical system shown in FIG. 2.

DETAILED DESCRIPTION OF THE PREFERRED EMBODIMENT

Figure 2:
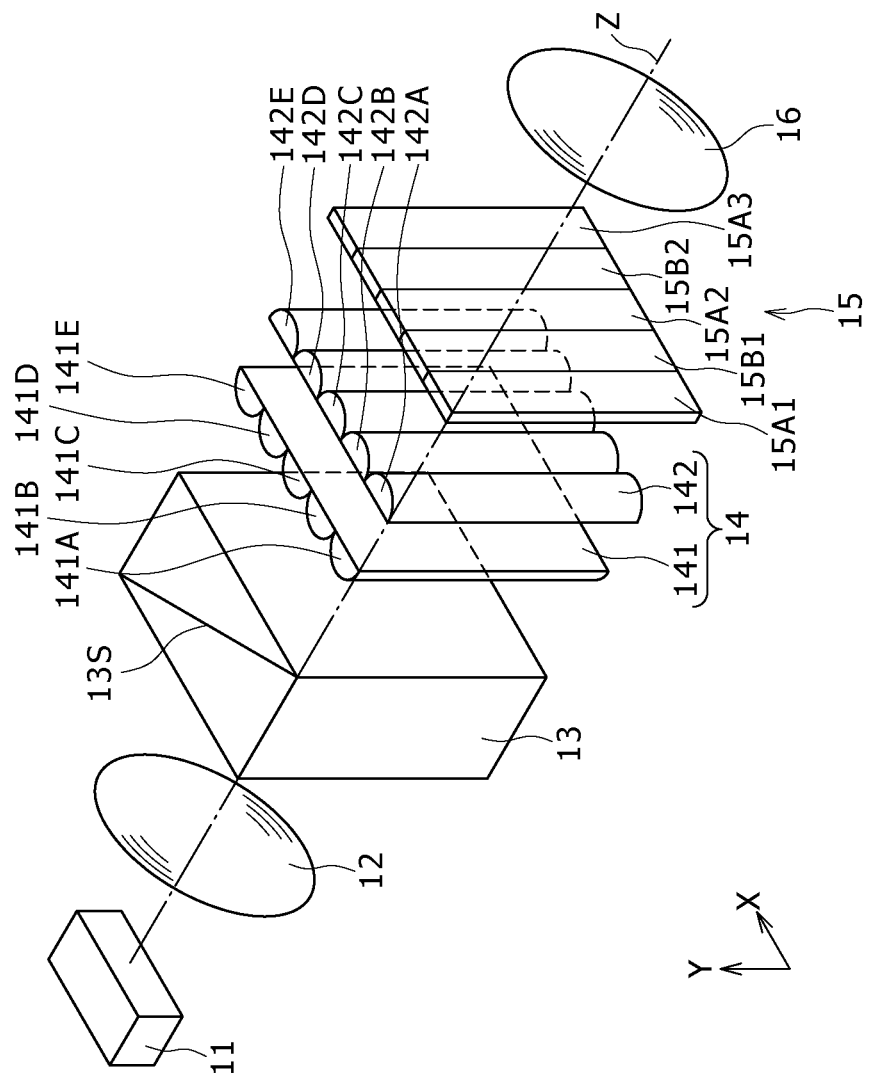
FIG. 2 is a perspective view showing the configuration of an irradiation optical system in the irradiation apparatus shown in FIG. 1.

A preferred embodiment of the present invention will now be described in detail with reference to the drawings.
(Configuration of Irradiation Apparatus)

An irradiation apparatus according to a preferred embodiment of the present invention will now be described with reference to FIG. 1. FIG. 1 shows the general configuration of the irradiation apparatus. As shown in FIG. 1, the irradiation apparatus includes a plurality of irradiation optical systems 1 (1A, 1B, and 1C), a stage 2, and a controller 4.

The irradiation optical systems 1A, 1B, and 1C function to apply laser light (linear beams elongated in the X direction as viewed in FIG. 1, i.e., having major axes in the X direction) to a workpiece 3 placed on the stage 2 under the control of the controller 4, thereby respectively forming a plurality of laser processed portions 30 (30A, 30B, and 30C) shown in FIG. 1. The stage 2 functions to place the workpiece 3 thereon and move it both in the X direction and in the Y direction as viewed in FIG. 1. The controller 4 functions to perform drive control for the irradiation optical systems 1 and scan control for the stage 2 in the XY plane.
(Operation of Irradiation Apparatus)

Laser light is emitted from the irradiation optical systems 1A, 1B, and 1C and applied to the workpiece 3 placed on the stage 2. Further, scan control for the stage 2 both in the X direction and in the Y direction is performed by the controller 4, thereby arbitrarily changing the relative position between the optical axis of the laser light and the workpiece 3 in the XY plane.

The workpiece 3 has a work surface 3S (see FIG. 3A) to be irradiated with the laser light. For example, the workpiece 3 has a structure such that a light absorbing layer is formed on an amorphous semiconductor film such as an amorphous silicon film. The light absorbing layer is formed of a material (e.g., metal material such as chromium or molybdenum) capable of absorbing the laser light from the irradiation optical systems 1 or generating heat due to an oxidation reaction by the laser light. The amorphous semiconductor film covered with the light absorbing layer is crystallized by thermal energy supplied from the light absorbing layer, so that the amorphous semiconductor film is changed to a polycrystalline semiconductor film constituting a part of a TFT (Thin-Film Transistor) device in a liquid crystal display or an organic EL display, for example.
(Configuration of Irradiation Optical System)

Figure 3A:
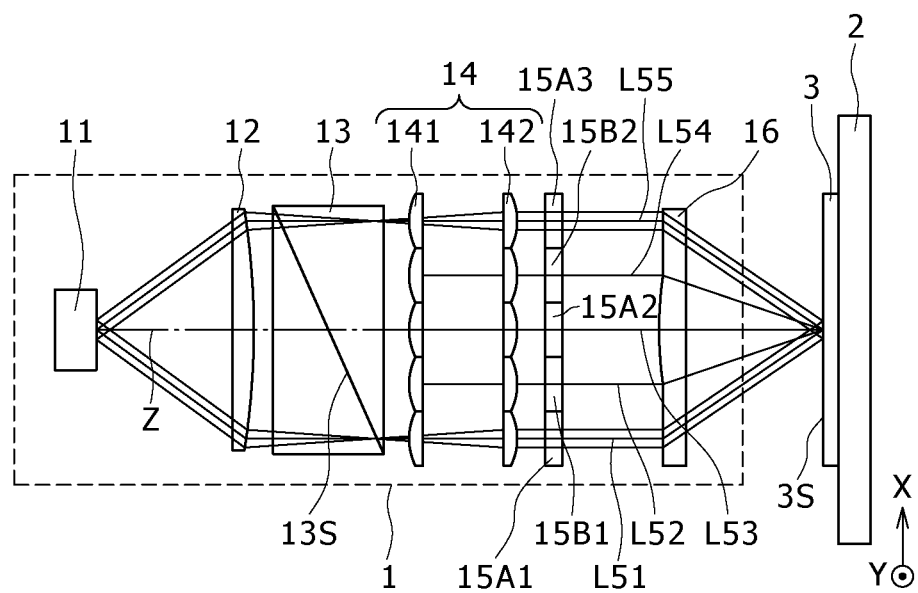
FIGS. 3A and 3B are sectional views showing the configuration of the irradiation optical system shown in FIG. 2.
Figure 3B:
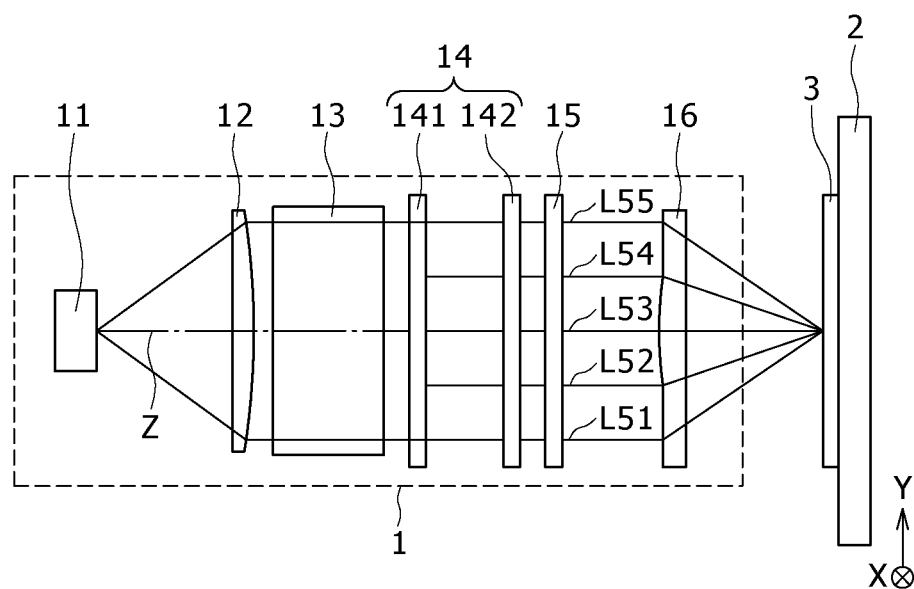

FIGS. 2, 3A, and 3B show the general configuration of each irradiation optical system 1 (1A, 1B, or 1C). FIG. 2 is a perspective view of each irradiation optical system 1, FIG. 3A is a sectional view taken along a plane containing an optical axis Z and an X axis shown in FIG. 2, and FIG. 3B is a sectional view taken along a plane containing the optical axis Z and a Y axis shown in FIG. 2.

Each irradiation optical system 1 includes a laser light source 11, a collimator lens 12, a polarization beam splitter 13, a cylindrical lens array pair 14, a quarter-wave plate array 15, and a condenser lens 16.

The laser light source 11 is configured by a broad area type semiconductor laser elongated in the X direction, for example (i.e., having a maximum spatial coherence in the X direction). As the laser light source 11, a semiconductor laser for emitting laser light having a wavelength of 700 to 1000 nm is preferably used. In particular, a high-power semiconductor laser for emitting laser light having a wavelength near 800 nm or near 940 nm is more preferably used. The laser light source 11 is relatively small in size, and as described later, it can easily form a linear beam spot of emitted laser light.

The collimator lens 12 is a lens having a positive power, and it functions to converge the X-axis components of the emitted laser light toward the cylindrical lens array pair 14 (see FIG. 3A) and also make the Y-axis components of the emitted laser light parallel to each other (see FIG. 3B).

The polarization beam splitter 13 includes a splitting surface 13S having an inclination angle with respect to the optical axis Z. The polarization beam splitter 13 functions as a polarization splitting section for splitting the laser light emitted from the laser light source 11 and passed through the collimator lens 12 into P-polarized light and S-polarized light different in polarization direction. More specifically, the splitting surface 13S of the polarization beam splitter 13 transmits the P-polarized light having a polarization direction along the X axis and reflects the S-polarized light having a polarization direction along the Y axis.

The cylindrical lens array pair 14 is composed of a pair of cylindrical lens arrays 141 and 142, and it functions to divide the P-polarized light from the polarization beam splitter 13 into a plurality of light beams, thereby uniforming the intensity distribution of the P-polarized light in the plane perpendicular to the optical axis Z. As shown in FIG. 2, the cylindrical lens array 141 is composed of a plurality of cylindrical lenses 141A to 141E arrayed in the X direction. Similarly, the cylindrical lens array 142 is composed of a plurality of cylindrical lenses 142A to 142E arrayed in the X direction. Thus, the number of the cylindrical lenses 141A to 141E is the same as that of the cylindrical lenses 142A to 142E. Each of the cylindrical lenses 141A to 141E and 142A to 142E has a cylindrical surface formed about an axis along the Y axis. The cylindrical lenses 141A to 141E are respectively opposed to the cylindrical lenses 142A to 142E in the direction along the optical axis Z. For example, the cylindrical lens 141A and the cylindrical lens 142A are in a one-to-one correspondence with each other so that the laser light passed through the cylindrical lens 141A enters the cylindrical lens 142A.

The quarter-wave plate array 15 is composed of a plurality of first quarter-wave plates 15A and a plurality of second quarter-wave plates 15B alternately arrayed in the X direction, and it functions to convert the linearly polarized light from the cylindrical lens array pair 14 into circularly polarized light. More specifically, three first quarter-wave plates 15A1, 15A2, and 15A3 are respectively opposed to the three cylindrical lenses 142A, 142C, and 142E, and function to convert the incident light beams of P-polarized light into light beams L51, L53, and L55 of right circularly polarized light (see FIG. 3A). On the other hand, two second quarter-wave plates 15B1 and 15B2 are respectively opposed to the two cylindrical lenses 142B and 142D, and function to convert the incident light beams of P-polarized light into light beams L52 and L54 of left circularly polarized light. All of the first and second quarter-wave plates 15A and 15B preferably have the same dimension in the X direction, so as to greatly suppress the interference fringes between the adjacent light beams.

Figure 4:
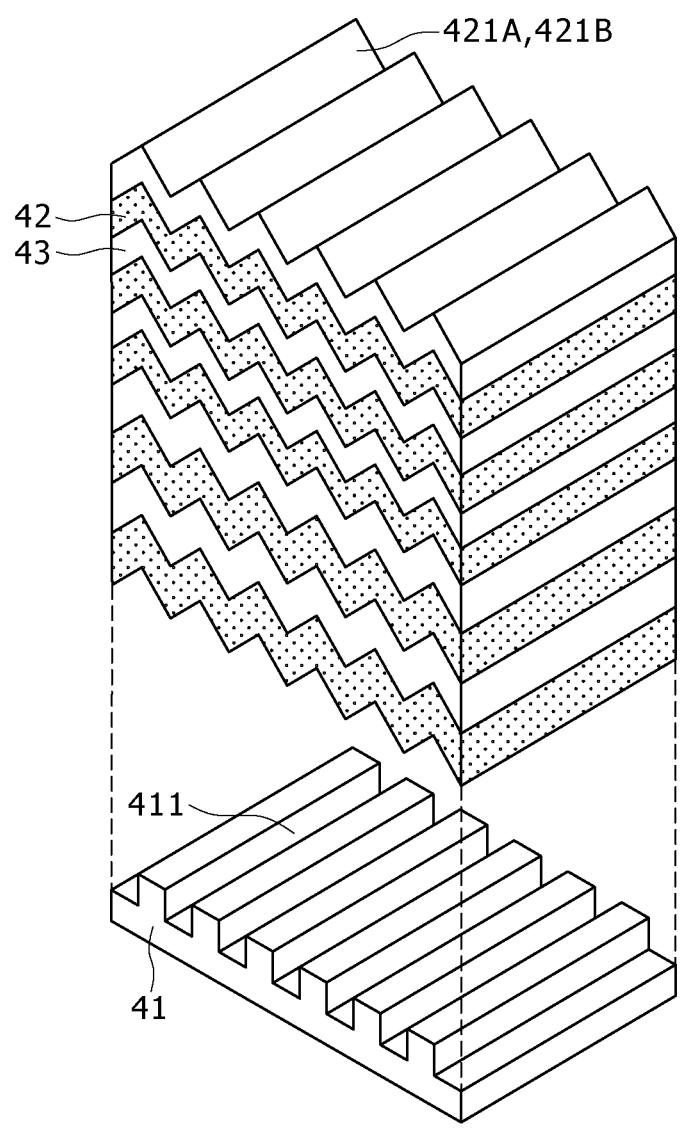
FIG. 4 is a perspective view showing the structure of a photonic crystal forming a quarter-wave plate array in the irradiation optical system shown in FIG. 2.
Figure 5:
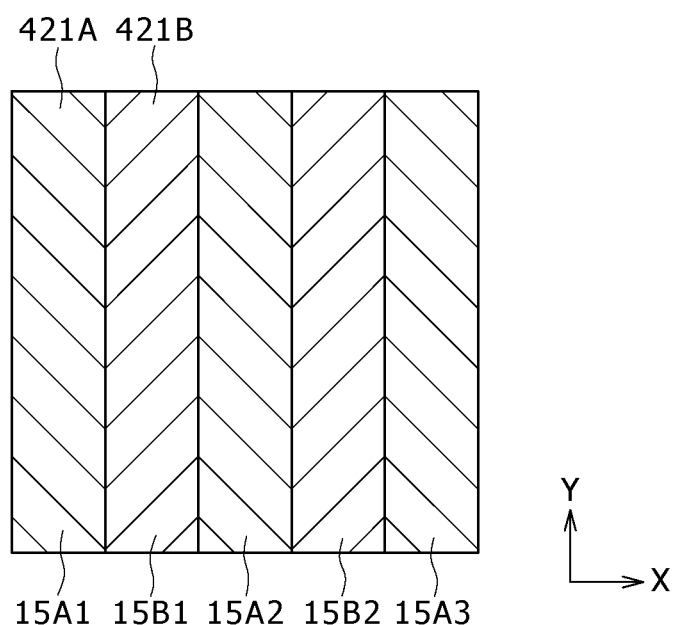
FIG. 5 is a plan view of the quarter-wave plate array formed from the photonic crystal shown in FIG. 4.

Each of the first and second quarter-wave plates 15A and 15B may be configured by a photonic crystal as shown in FIG. 4. FIG. 4 is a perspective view showing an example of the configuration of a photonic crystal produced by a so-called self-cloning process. This photonic crystal has a multilayer structure such that a plurality of two kinds of optical thin films (high-index layers 42 and low-index layers 43) formed of transparent materials having different refractive indices are alternately layered on a transparent substrate 41 formed of silica glass, for example. The transparent substrate 41 is formed with a plurality of grooves 411 extending in one direction. Each of the high-index layers 42 and the low-index layers 43 has an uneven shape according to the grooves 411 (i.e., a zigzag shape formed by alternate projections and depressions) as viewed in a cross section taken in the layering direction. Examples of the material forming each high-index layer 42 include semiconductor materials such as silicon (Si) and germanium (Ge), oxides/nitrides such as $Ta_2O_5$, $TiO_2$, $Nb_2O_5$, $HfO_2$, $Al_2O_3$, and $Si_3N_4$, and mixtures thereof. On the other hand, each low-index layer 43 may be formed of $SiO_2$, for example. Further, as shown in FIG. 5, the direction of formation of each projection 421A corresponding to each groove 411 in each first quarter-wave plate 15A is perpendicular to the direction of formation of each projection 421B corresponding to each groove 411 in each second quarter-wave plate 15B. Further, the direction of formation of each projection 421A and the direction of formation of each projection 421B are inclined 45° with respect to the X direction and the Y direction. Accordingly, the fast axis (or slow axis) of each first quarter-wave plate 15A is perpendicular to that of each second quarter-wave plate 15B, so that the direction of rotation of the circularly polarized light from each first quarter-wave plate 15A is opposite to that of the circularly polarized light from each second quarter-wave plate 15B.

The condenser lens 16 is a lens of a spherical optical system, and it functions to condense and superimpose the plural light beams L51 to L55 passed through the first and second quarter-wave plates 15A and 15B. More specifically, the condenser lens 16 functions to condense the Y-axis components of the light beams L51 to L55 on the work surface 3S of the workpiece 3 (see FIG. 3B) and also superimpose the X-axis components of the light beams L51 to L55 on the work surface 3S of the workpiece 3, thereby uniformly irradiating the work surface 3S in the X direction (see FIG. 3A). As a result, an image by a linear beam uniformed in the X direction is formed on the work surface 3S.

(Operation of Irradiation Optical System)

In relation to the X direction shown in FIG. 3A, the laser light emitted from the laser light source 11 is passed through the collimator lens 12 and next split into P-polarized light and S-polarized light by the polarization beam splitter 13. The P-polarized light is passed through the polarization beam splitter 13 and next divided into a plurality of light beams by the cylindrical lens array pair 14. Each light beam next enters the first quarter-wave plate 15A or the second quarter-wave plate 15B corresponding to each cylindrical lens. Thereafter, the light beams incident on the first quarter-wave plates 15A1, 15A2, and 15A3 are respectively converted into the light beams L51, L53, and L55 of right circularly polarized light by these first quarter-wave plates, and the light beams incident on the second quarter-wave plates 15B1 and 15B2 are respectively converted into the light beams L52 and L54 of left circularly polarized light by these second quarter-wave plates. The light beams L51 to L55 are superimposed on the work surface 3S of the workpiece 3 by the condenser lens 16 to form a linear beam extending in the X direction in the condition where the luminance in the X direction is uniformed. Thus, the work surface 3S is irradiated with this linear beam. As mentioned above, the light beams L51, L53, and L55 of right circularly polarized light and the light beams L52 and L54 of left circularly polarized light are emerged from the quarter-wave plate array 15 so as to be arrayed adjacent to each other, so that the generation of interference fringes in the X direction can be sufficiently suppressed. Particularly in the case that all of the first and second quarter-wave plates 15A and 15B have the same dimension in the X direction, the generation of interference fringes can be greatly suppressed.

On the other hand, in relation to the Y direction shown in FIG. 3B, the laser light emitted from the laser light source 11 is collimated by the collimator lens 12 and next passed through the polarization beam splitter 13, the cylindrical lens array pair 14, and the quarter-wave plate array 15 in this order. Thereafter, the laser light emerged from the quarter-wave plate array 15 is condensed toward the work surface 3S of the workpiece 3 by the condenser lens 16.

Figure 6A:
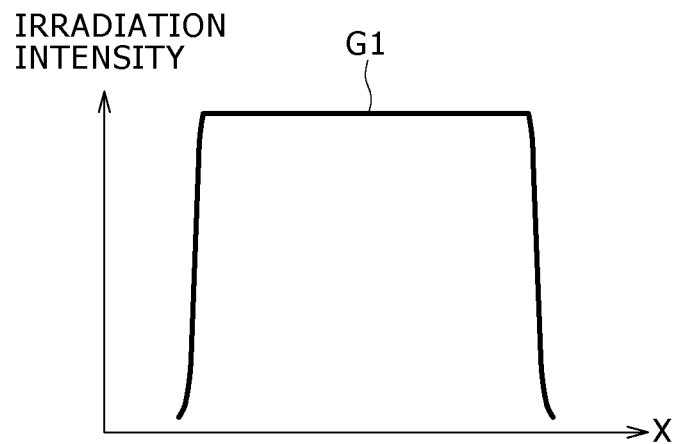
FIGS. 6A and 6B are graphs showing the irradiation intensity distributions of a linear beam formed by the irradiation optical system shown in FIG. 2.
Figure 6B:
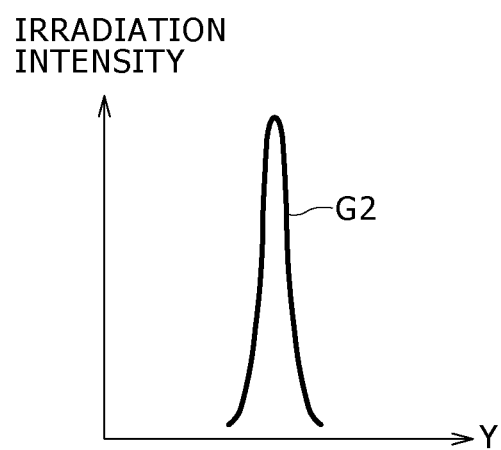

Accordingly, a linear beam having irradiation intensity distributions G1 and G2 respectively shown in FIGS. 6A and 6B are applied to the work surface 3S of the workpiece 3. FIG. 6A shows the irradiation intensity distribution G1 of the linear beam in the X direction corresponding to a broad-band area direction of the laser light source 11, and FIG. 6B shows the irradiation intensity distribution G2 of the linear beam in the minor-axis direction (Y direction) of the laser light source 11. As shown in FIGS. 6A and 6B, the linear beam applied to the work surface 3S has an irradiation intensity distribution greatly steep in the Y direction and has an irradiation intensity distribution flat in the X direction.

Figure 7:
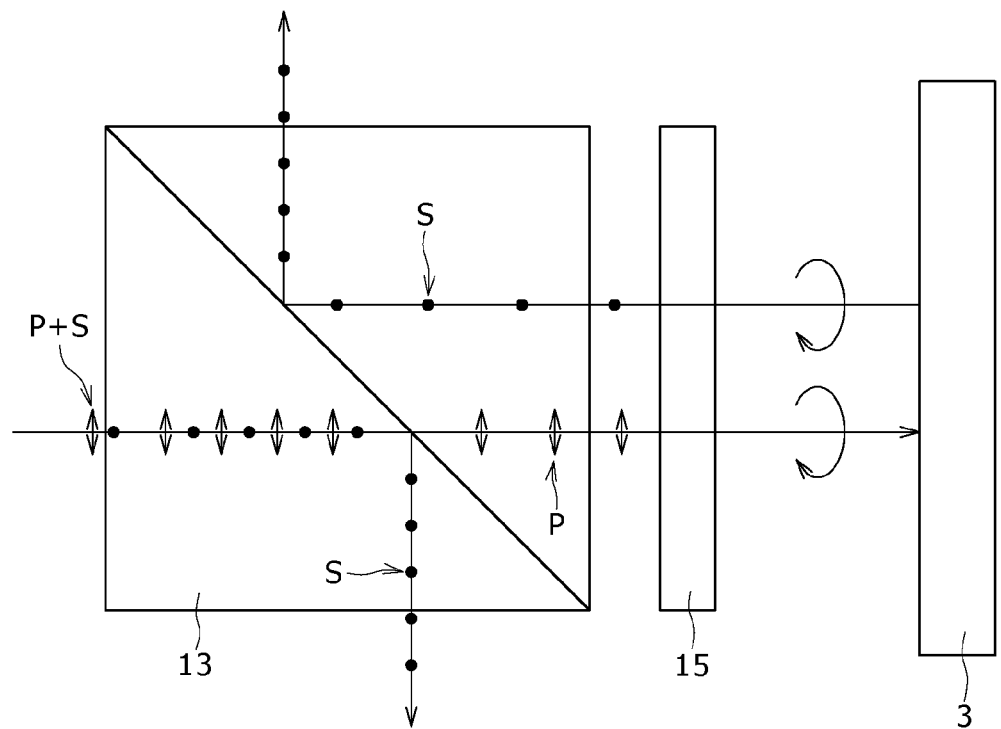
FIG. 7 is a sectional view showing the polarization directions of a light beam entering a polarization beam splitter in the irradiation optical system shown in FIG. 2.

Further, the polarization beam splitter 13 and the quarter-wave plate array 15 function as a so-called isolator, which can prevent reflected light from the work surface 3S of the workpiece 3 from being returned to the laser light source 11, thereby preventing damage to the laser light source 11. More specifically, as shown in FIG. 7, the P-polarized light passed through the polarization beam splitter 13 is changed in phase by 90° by the pass through the first quarter-wave plates 15A to become right circularly polarized light. This right circularly polarized light is reflected on the work surface 3S of the workpiece 3 to reenter the first quarter-wave plates 15A as left circularly polarized light (return laser light). This left circularly polarized light is changed in phase by 90° by the pass through the first quarter-wave plates 15A to become S-polarized light. This S-polarized light is reflected on the splitting surface 13S of the polarization beam splitter 13, thereby avoiding the arrival of the return laser light at the laser light source 11. In FIG. 7, the cylindrical lens array pair 14 is not shown.

As described above, in the irradiation apparatus according to this preferred embodiment, the laser light emitted from the laser light source 11 is divided into a plurality of light beams, which are next converted into right circularly polarized light and left circularly polarized light. The light beams of right circularly polarized light and the light beams of left circularly polarized light are alternately arrayed in the X direction. Accordingly, the interference between the adjacent light beams in the X direction can be avoided. Accordingly, a linear beam having a uniform irradiation intensity distribution in the X direction can be applied to the work surface 3S of the workpiece 3 in the condition where the generation of interference fringes in the X direction can be sufficiently reduced. Furthermore, the polarization beam splitter 13 constituting an isolator in combination with the quarter-wave plate array 15 is located upstream of the quarter-wave plate array 15 toward the laser light source 11, so that the reflected light (return laser light) from the work surface 3S toward the laser light source 11 can also be sufficiently reduced. Accordingly, it is possible to stabilize the oscillating operation of the laser light source 11 and extend the life of the laser light source 11.

(Manufacturing Method for Semiconductor Device Using the Irradiation Apparatus)

A manufacturing method for a thin-film transistor device using the above-mentioned irradiation apparatus will now be described with reference to FIGS. 8A to 8G. FIGS. 8A to 8G are sectional views showing the steps of the manufacturing method for the thin-film transistor device.

Figure 8A:
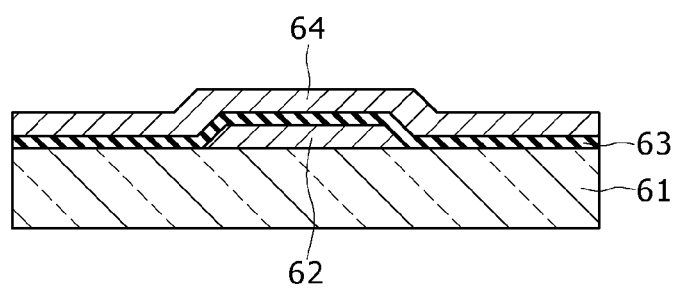

As shown in FIG. 8A, an insulating substrate 61 such as a glass substrate or a plastic substrate is prepared. The substrate 61 may be provided by a substrate having an insulating surface. For example, the substrate 61 may be provided by a substrate composed of a semiconductor substrate and an insulating layer formed on the semiconductor substrate.

A gate electrode 62 is selectively formed on the substrate 61. For example, the gate electrode 62 may be formed of a material having good conductivity, such as molybdenum (Mo).

A gate insulating film 63 of silicon nitride, silicon oxide, or metal oxides, for example, is next formed by sputtering or CVD, for example, so as to cover the substrate 61 and the gate electrode 62.

An amorphous silicon film 64 as a semiconductor thin film is next formed on the gate insulating film 63 by sputtering or CVD, for example. The amorphous silicon film 64 has a thickness of 10 to 50 nm, for example. In the case of performing a crystallization process for the amorphous silicon film 64 by the irradiation with laser light in the subsequent step, the thickness of the amorphous silicon film 64 is preferably set to 20 nm or less.

Figure 8B:
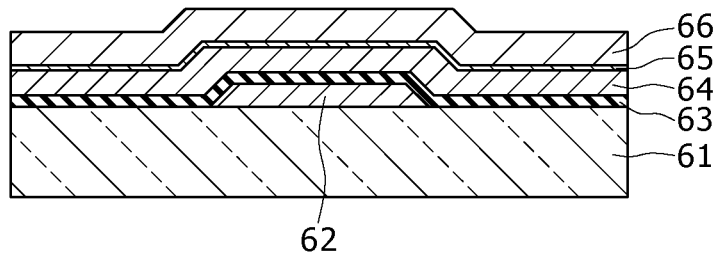

As shown in FIG. 8B, a buffer layer 65 is next formed on the amorphous silicon film 64, and a light absorbing layer 66 is next formed on the buffer layer 65. The buffer layer 65 functions to prevent that a metal material mainly forming the light absorbing layer 66 may be diffused into the amorphous silicon film 64 in subsequently performing the crystallization process for the amorphous silicon film 64 (the irradiation of the light absorbing layer 66 with laser light). The buffer layer 65 also functions to prevent a thermal reaction between the metal material of the light absorbing layer 66 and the silicon of the amorphous silicon film 64. For example, the buffer layer 65 is formed of silicon oxide and has a thickness of 5 to 50 nm. The light absorbing layer 66 is formed of a material capable of absorbing laser light and converting it into heat in the subsequent laser light applying step. Examples of the metal material forming the light absorbing layer 66 include chromium (Cr), molybdenum (Mo), tantalum (Ta), titanium (Ti), tungsten (W), and cobalt (Co). The light absorbing layer 66 may be formed of silicide such as WSi, MoSi, TiSi, TaSi, and CoSi. In the case of forming the light absorbing layer 66 by using molybdenum, the thickness of the light absorbing layer 66 is preferably set to 50 to 300 nm.

Figure 8C:
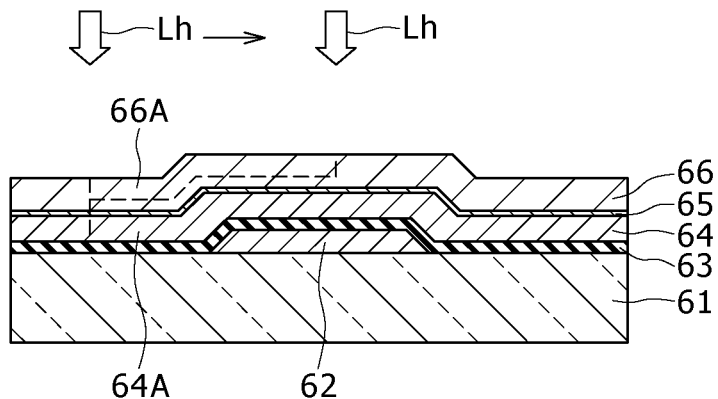

After forming the light absorbing layer 66, laser light Lh as energy radiation is applied to the light absorbing layer 66 as shown in FIG. 8C. For example, the above-mentioned irradiation apparatus (see FIG. 1) is used and the laser light Lh having an absorption wavelength to the light absorbing layer 66 is used in an atmosphere containing oxygen. More specifically, the workpiece 3 prepared by sequentially forming the gate electrode 62, the gate insulating film 63, the amorphous silicon film 64, the buffer layer 65, and the light absorbing layer 66 on the substrate 61 as mentioned above is first placed on the stage 2. Thereafter, the stage 2 is moved in the XY plane by the controller 4 to thereby initially position the optical axis Z of each irradiation optical system 1 and the work surface 3S of the workpiece 3. Thereafter, laser light having a predetermined wavelength and intensity is oscillated from the laser light source 11 by the controller 4 to thereby apply the laser light Lh to the light absorbing layer 66. Accordingly, the laser light Lh is absorbed by the light absorbing layer 66 exposed to the oxygen-containing atmosphere, thereby heating the light absorbing layer 66. As a result, the light absorbing layer 66 is oxidized in the vicinity of the exposed surface thereof in a region irradiated with the laser light Lh, thereby forming an oxide layer 66A. More specifically, by the thermal energy due to the heat generation caused by the absorption of the laser light Lh in the vicinity of the exposed surface of the light absorbing layer 66 and the heat of reaction caused by the formation of the oxide layer 66A, the amorphous silicon film 64 formed under the oxide layer 66A is crystallized (i.e., annealed). By moving the stage 2 as applying the laser light Lh to the light absorbing layer 66 as mentioned above, a predetermined region of the light absorbing layer 66 is sequentially converted into the oxide layer 66A, and the corresponding region of the amorphous silicon film 64 is sequentially crystallized.

As a result, a microcrystalline silicon film 64A is formed by the crystallization of the amorphous silicon film 64. Although a polycrystalline silicon film may be formed instead of the microcrystalline silicon film 64A, it is preferable to microcrystallize the amorphous silicon film 64 in a non-melting mode, so as to more improve the performance of a thin-film transistor device. As compared with a thin-film transistor device using a polycrystalline silicon film for a channel region, variations in characteristics between devices can be more suppressed. As described above, the thickness of the amorphous silicon film 64 is preferably set to 20 nm or less, thereby microcrystallizing the amorphous silicon film 64 in the condition where the particle size of silicon does not become so large, but becomes stabler. Accordingly, in this case, variations in characteristics between devices can be further suppressed. Further, since the amorphous silicon film 64 is microcrystallized in a non-melting mode, the amorphous silicon film 64 is not heated to its melting point. Accordingly, even when a glass substrate or plastic substrate having low heat resistance is used as the substrate 61, damage to the substrate 61 can be prevented. Such a microcrystallized condition can be confirmed by a Raman spectrum. That is, a microcrystalline silicon film is different in peak shape of a Raman spectrum from a polycrystalline silicon film. For example, a broad peak distinctively appears at a wave number of 480 to 520 $cm^{-1}$ in a microcrystalline silicon film. On the other hand, such a peak does not appear at a wave number of 480 to 520 $cm^{-1}$ in a polycrystalline silicon film.

Such an annealing step of oxidizing the exposed surface of the light absorbing layer 66 can be performed by controlling the irradiation energy of the laser light Lh.

After microcrystallizing the amorphous silicon film 64 to form the microcrystalline silicon film 64A, the light absorbing layer 66 and the buffer layer 65 are sequentially removed by etching. In the case of using an insulating film of silicon materials such as SiNx, SiOx, and SiON as the buffer layer 65, the buffer layer 65 may not be removed, but it may be used as an etching stop layer or a part thereof, which will be hereinafter described.

Figure 8D:
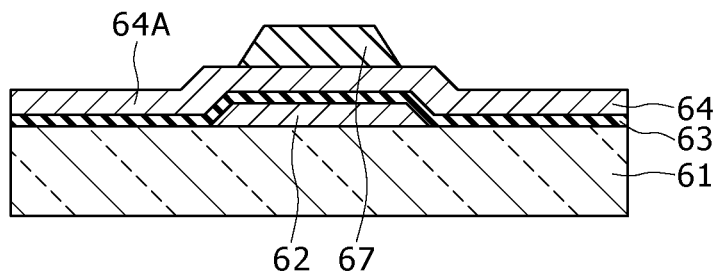

As shown in FIG. 8D, an etching stop layer 67 is patterned on the microcrystalline silicon film 64A in a region corresponding to the gate electrode 62. The etching stop layer 67 is formed by first forming an insulating film of silicon materials such as SiNx, SiOx, and SiON, next forming a resist pattern by back exposure, and next etching the above insulating film by using the resist pattern as a mask. The thickness of the etching stop layer 67 is set to 50 to 500 nm, for example.

Figure 8E:
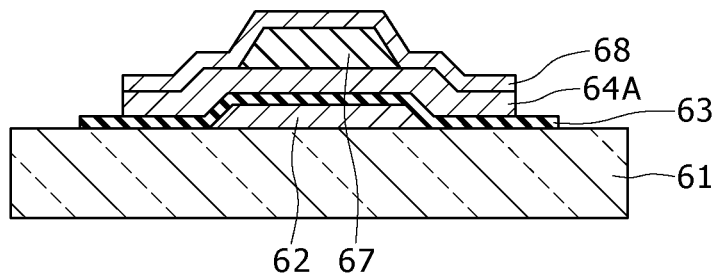

As shown in FIG. 8E, an $n^+$ amorphous silicon film 68 is formed by CVD, for example, so as to cover the etching stop layer 67 and the microcrystalline silicon film 64A. Thereafter, the $n^+$ amorphous silicon film 68 and the microcrystalline silicon film 64A are simultaneously patterned. The thickness of the $n^+$ amorphous silicon film 68 is set to 10 to 300 nm, for example.

As shown in FIG. 8F, a metal layer 69 of aluminum (Al), titanium (Ti), or a laminate thereof is formed by sputtering, for example, so as to fully cover the exposed surface of the substrate 61, and next patterned into a predetermined shape. More specifically, the metal layer 69 and the $n^+$ amorphous silicon film 68 are patterned so as to be divided in a region above the gate electrode 62 by etching using a resist pattern (not shown) as a mask. Accordingly, the metal layer 69 is divided into a source electrode 69S and a drain electrode 69D, and the $n^+$ amorphous silicon film 68 is divided into a source 68S and a drain D.

Thus, a bottom gate type thin-film transistor device Tr is completed, wherein the microcrystalline silicon film 64A functions as a channel region. Thereafter, as shown in FIG. 8G, a passivation film 70 of silicon nitride, for example, may be formed by CVD, for example, so as to cover the source electrode 69S and the drain electrode 69D.

According to the manufacturing method for the thin-film transistor device Tr mentioned above, the irradiation apparatus shown in FIG. 1 is used, so that the generation of interference fringes can be sufficiently reduced and the laser light Lh having a uniform intensity distribution can be applied toward the amorphous silicon film 64. Further, the laser light emitted from the laser light source 11 is split into P-polarized light and S-polarized light before converted into right circularly polarized light and left circularly polarized light. Accordingly, reflected light from the work surface 3S toward the laser light source 11 can be sufficiently reduced, thereby realizing the stabilization of the oscillating operation and the extension of the life of the laser light source 11. As a result, the microcrystalline silicon film 64A uniformly crystallized can be formed and the thin-film transistor device Tr having an excellent performance can therefore be manufactured.

While a specific embodiment of the present invention has been described above, the present invention is not limited to the above preferred embodiment, but various modifications may be made. For example, while the single collimator lens 12 is used as the light beam collimating section, and the single condenser lens 16 is used as the projection optical system in the above preferred embodiment, the present invention is not limited to this configuration. That is, a plurality of lenses or optical members may be used as each of the light beam collimating section and the projection optical system.

Further, while the laser light from the laser light source is split into P-polarized light and S-polarized light before divided into a plurality of light beams in the above preferred embodiment, these steps may be changed in order. That is, the laser light from the laser light source may be first divided into a plurality of light beams, and each light beam may be next split into P-polarized light and S-polarized light. More specifically, the polarization beam splitter 13 and the cylindrical lens array pair 14 shown in FIG. 2 may be changed in position, so that the cylindrical lens array pair 14 and the polarization beam splitter 13 may be arranged in this order from the side of the laser light source 11.

Further, while each cylindrical lens array as the light beam dividing section is formed by arranging the plural cylindrical lenses in the X direction, the present invention is not limited to this configuration. For example, as shown in FIG. 9, a lens array pair 24 composed of a pair of lens arrays may be used, wherein each lens array is formed by arraying a plurality of lenses both in the X direction and in the Y direction. In association therewith, a quarter-wave plate array 25 is preferably used, wherein a plurality of first quarter-wave plates 25A and a plurality of second quarter-wave plates 25B are alternately arranged both in the X direction and in the Y direction. According to this modification, interference in the Y direction can also be avoided to thereby more uniform the intensity distribution of the irradiation light.

Further, in the manufacturing method for the thin-film transistor device Tr mentioned above, the laser light is applied to the light absorbing layer 66 formed through the buffer layer 65 on the amorphous silicon film 64, thereby producing thermal energy, which is used for the crystallization of the amorphous silicon film 64. However, the present invention is not limited to this configuration. For example, the laser light may be applied directly to the amorphous silicon film 64, thereby crystallizing the amorphous silicon film 64.

The present application contains subject matter related to that disclosed in Japanese Priority Patent Application JP 2009-144527 filed in the Japan Patent Office on Jun. 17, 2009, the entire content of which is hereby incorporated by reference.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. A manufacturing method for a semiconductor device comprising the steps of:
    forming an amorphous semiconductor film and a light absorbing layer in this order on a substrate; and
    annealing by applying laser light to said light absorbing layer to heat said light absorbing layer, crystallizing said amorphous semiconductor film to form a crystalline semiconductor film;
said annealing step including the steps of:
    oscillating emitted laser light from a laser light source;
    splitting said emitted laser light into first linearly polarized light and second linearly polarized light different in polarization direction;
    dividing said first or second linearly polarized light into a plurality of light beams;
    converting said light beams into right circularly polarized light and left circularly polarized light alternately arranged in a first direction perpendicular to an optical axis; and
    condensing said right circularly polarized light and said left circularly polarized light toward said light absorbing layer to be irradiated.

* * * * *